United States Patent
Razouk

(10) Patent No.: US 7,067,895 B1
(45) Date of Patent: Jun. 27, 2006

(54) COLOR IMAGER CELL WITH TRANSISTORS FORMED UNDER THE PHOTODIODES

(75) Inventor: Reda Razouk, Sunnyvale, CA (US)

(73) Assignee: Eastman Kodak Company, Rochester, NY (US)

( * ) Notice: Subject to any disclaimer, the term of this patent is extended or adjusted under 35 U.S.C. 154(b) by 23 days.

(21) Appl. No.: 10/340,165

(22) Filed: Jan. 10, 2003

(51) Int. Cl.
  *H01L 31/06* (2006.01)
(52) U.S. Cl. .................... 257/461; 257/462; 257/465
(58) Field of Classification Search ......... 257/461–466
  See application file for complete search history.

(56) References Cited

U.S. PATENT DOCUMENTS

| | | | | |
|---|---|---|---|---|
| 5,128,732 A | * | 7/1992 | Sugahara et al. | ........... 257/353 |
| 5,144,395 A | * | 9/1992 | Miyajima et al. | ........... 257/290 |
| 6,177,293 B1 | * | 1/2001 | Netzer et al. | ................. 438/73 |
| 6,423,569 B1 | * | 7/2002 | Zhang et al. | .................. 438/98 |
| 6,727,521 B1 | | 4/2004 | Merrill | ......................... 257/98 |
| 2004/0041224 A1 | * | 3/2004 | Chao et al. | .................. 257/444 |

OTHER PUBLICATIONS

Retrieved from Purdue University Website using Internet <URL: http://www.purdue.edu/UNS/html4ever/9907.Neudeck.chips.html, "Engineers Way to Faster, Less-Costly, Computer Chips", Purdue News, Aug. 1999, pp. 1-4, [online], [retrieved on Jan, 10, 2003].
Retrieved from Silicon Vision Website using Internet <URL: http://www.siliconvision.de, "Introduction to TFA", 1 page, [online], [retrieved on Jan. 10, 2003].

* cited by examiner

*Primary Examiner*—H. Jey Tsai
(74) *Attorney, Agent, or Firm*—Peyton C. Watkins

(57) ABSTRACT

An imaging cell and a method of forming the imaging cell are disclosed. The imaging cell includes a first transistor that has source, a drain, and a gate, and a second transistor that has a source, a drain, and a gate connected to the source of the first transistor. In addition, the cell has a photodiode that is partially formed over the source of the second transistor.

5 Claims, 21 Drawing Sheets

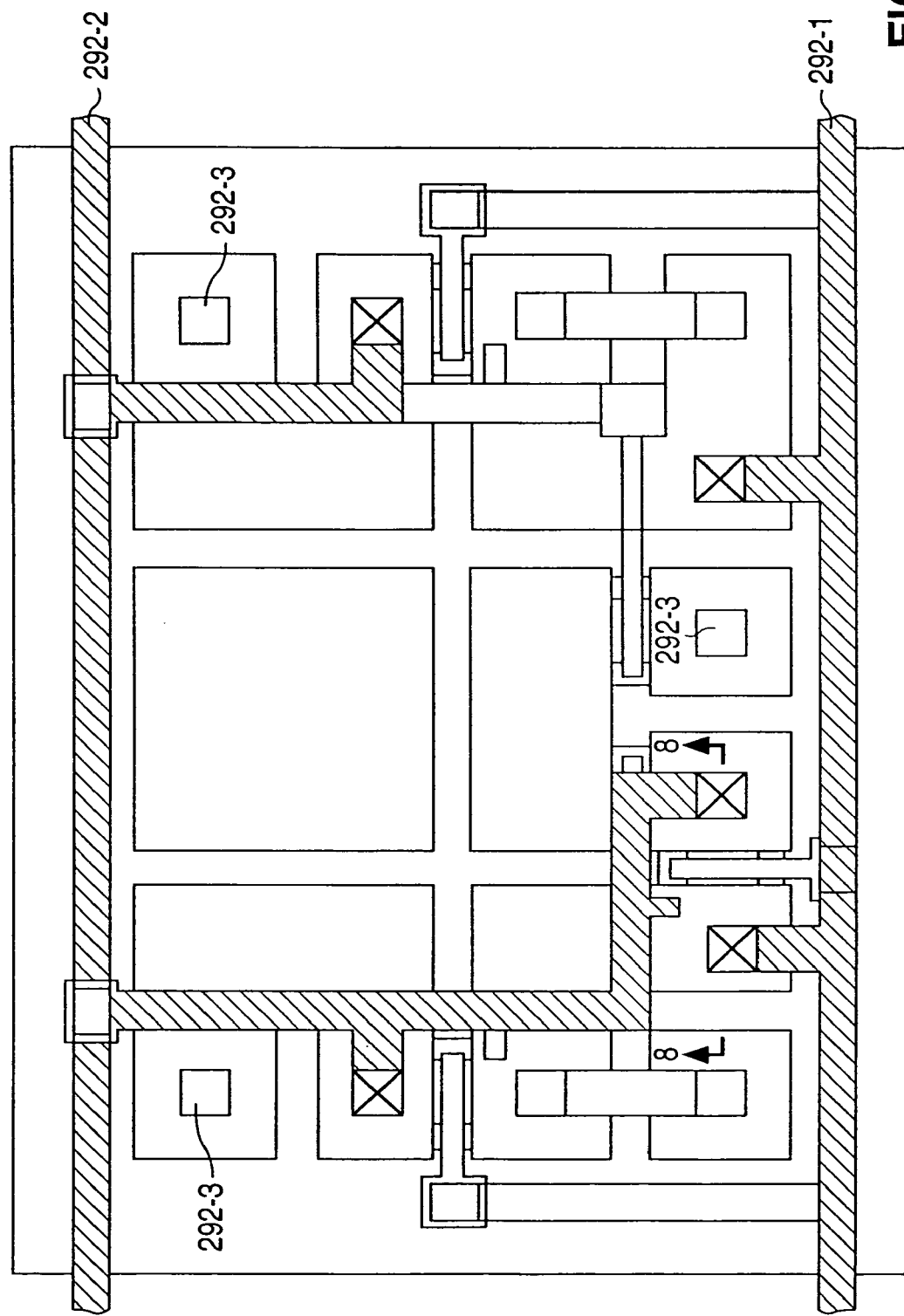

COLOR IMAGER CELL WITH TRANSISTORS FORMED UNDER THE PHOTODIODES

DETAILED DESCRIPTION OF THE INVENTION

Figure 1:
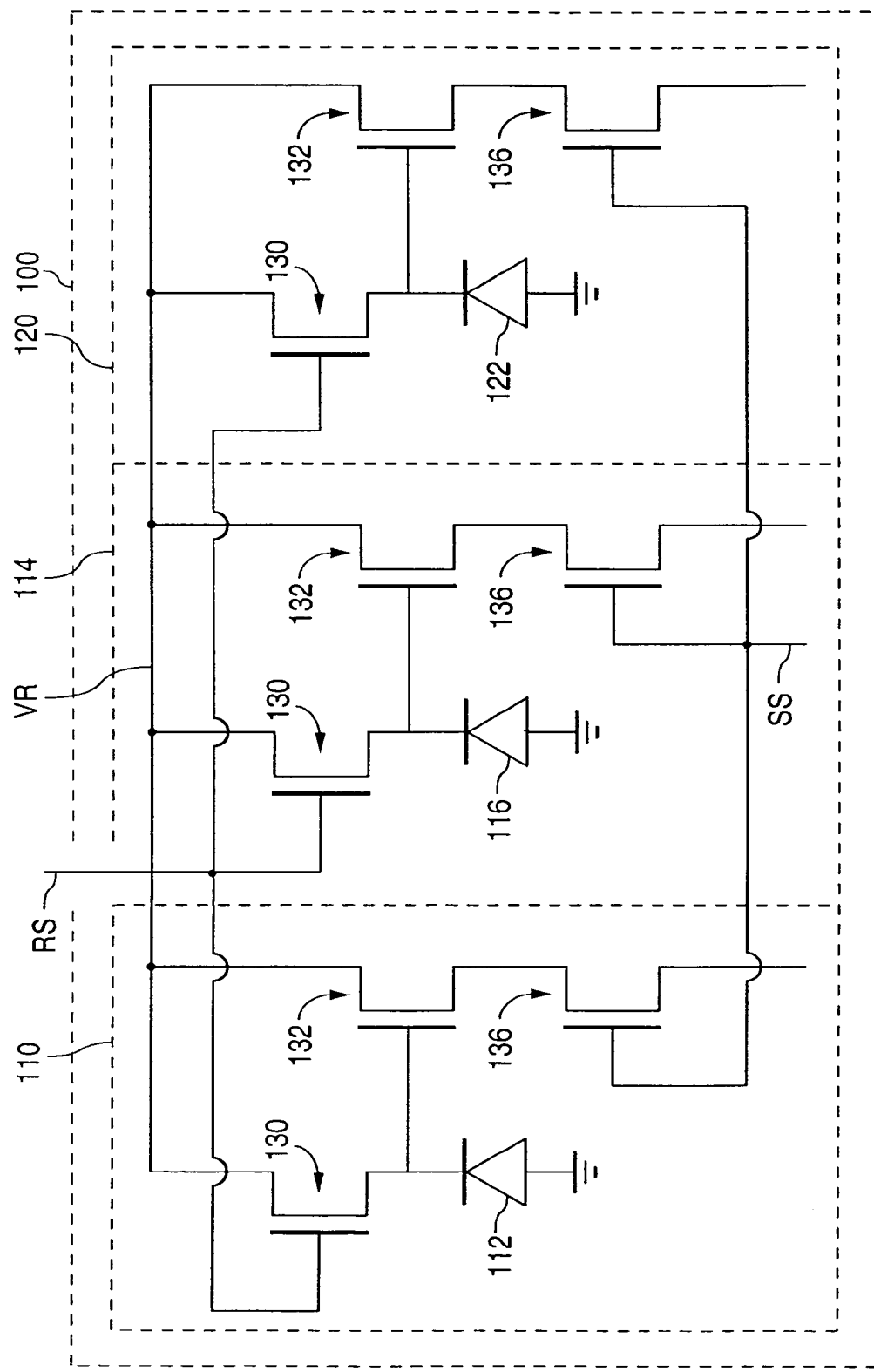
FIG. 1 is a circuit drawing illustrating an example of a color pixel cell 100 in accordance with the present invention.

FIG. 1 shows a circuit drawing that illustrates an example of a color pixel cell 100 in accordance with the present invention. As shown in the FIG. 1 example, cell 100 includes a red pixel cell 110 that has a red photodiode 112, a green pixel cell 114 that has a green photodiode 116, and a blue pixel cell 120 that has a blue photodiode 122.

Further, each cell 110, 114, and 120 also has a reset transistor 130, a source-follower transistor 132, and a select transistor 136. Each reset transistor 130 has a source, a drain connected to a reset voltage VR, and a gate connected to receive a reset signal RS. Although the gates are shown connected together in the FIG. 1 example, the gates can alternately be connected to receive individual reset signals.

In addition, each source-follower transistor 132 has a source, a drain connected to the reset voltage VR, and a gate connected to the source of the reset transistor 130. The gate is also connected to the corresponding photodiode 112, 116, and 122 of the cell 110, 114, and 120, respectively.

Each select transistor 136 has a source, a drain connected to the source of the source-follower transistor 132, and a gate connected to receive a select signal SS. Although the gates are shown connected together in the FIG. 1 example, the gates can alternately be connected to receive individual select signals.

In operation, the gates of the reset transistors 130 are pulsed on to reset (place a positive voltage on) the n+ regions of the photodiodes 112, 116, and 122. The photodiodes 112, 116, and 122 then collect light information in the form of photons for an integration period. The collected photons, in turn, reduce the magnitudes of the potentials placed on the n+ regions of the photodiodes 112, 116, and 122.

At the same time, values equal to a threshold voltage drop below the potentials on the n+ regions of the photodiodes 112, 116, and 122 are also present on the sources of the source-follower transistors 132. At the end of the integration period of time, the gates of the select transistors 136 are pulse on and the values are read out.

Figure 2A:
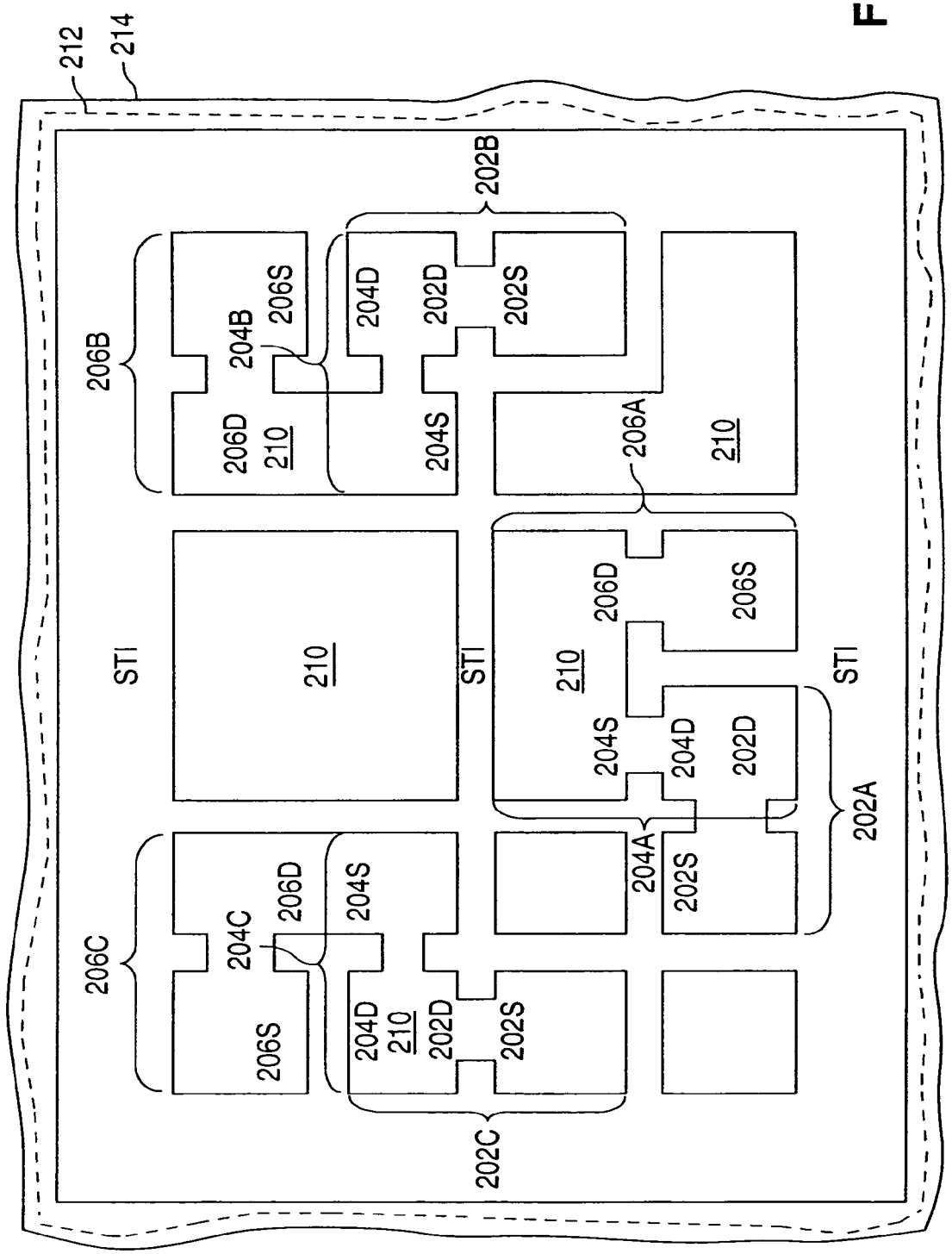
FIGS. 2A–2X are a series of views illustrating an example of a method of forming a color imaging cell 200 in accordance with the present invention.
Figure 2B:
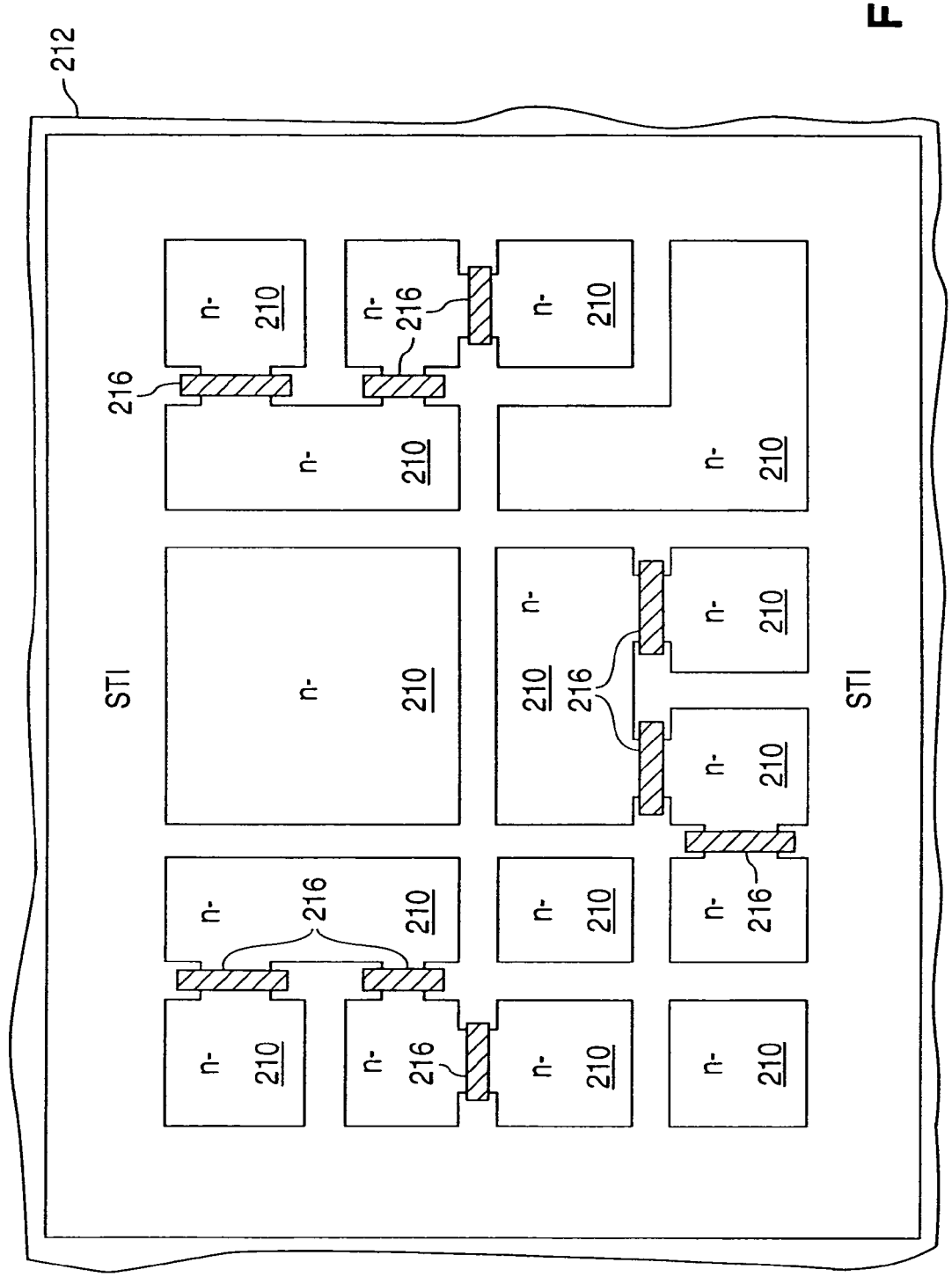
Figure 2C:
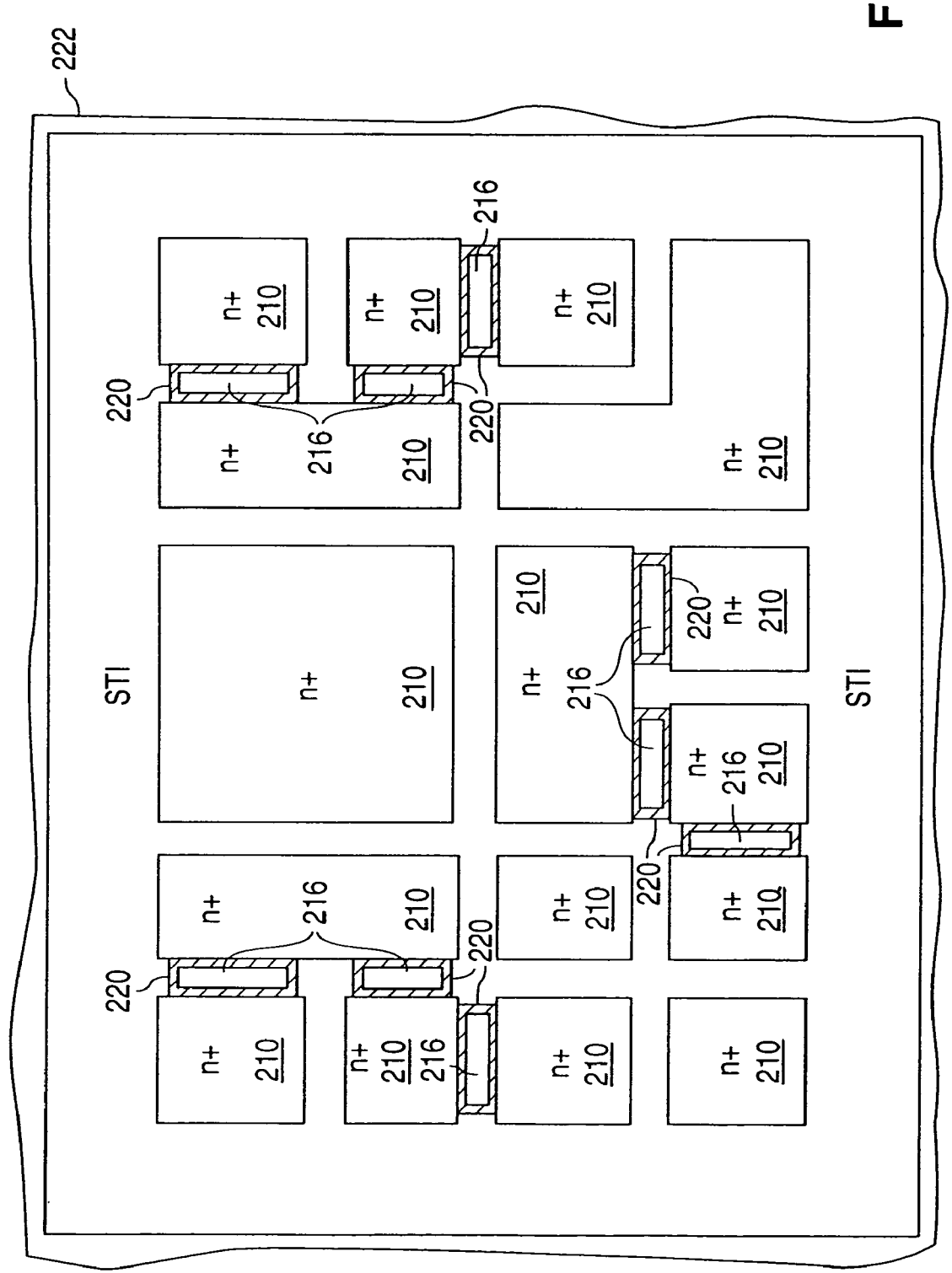
Figure 2D:
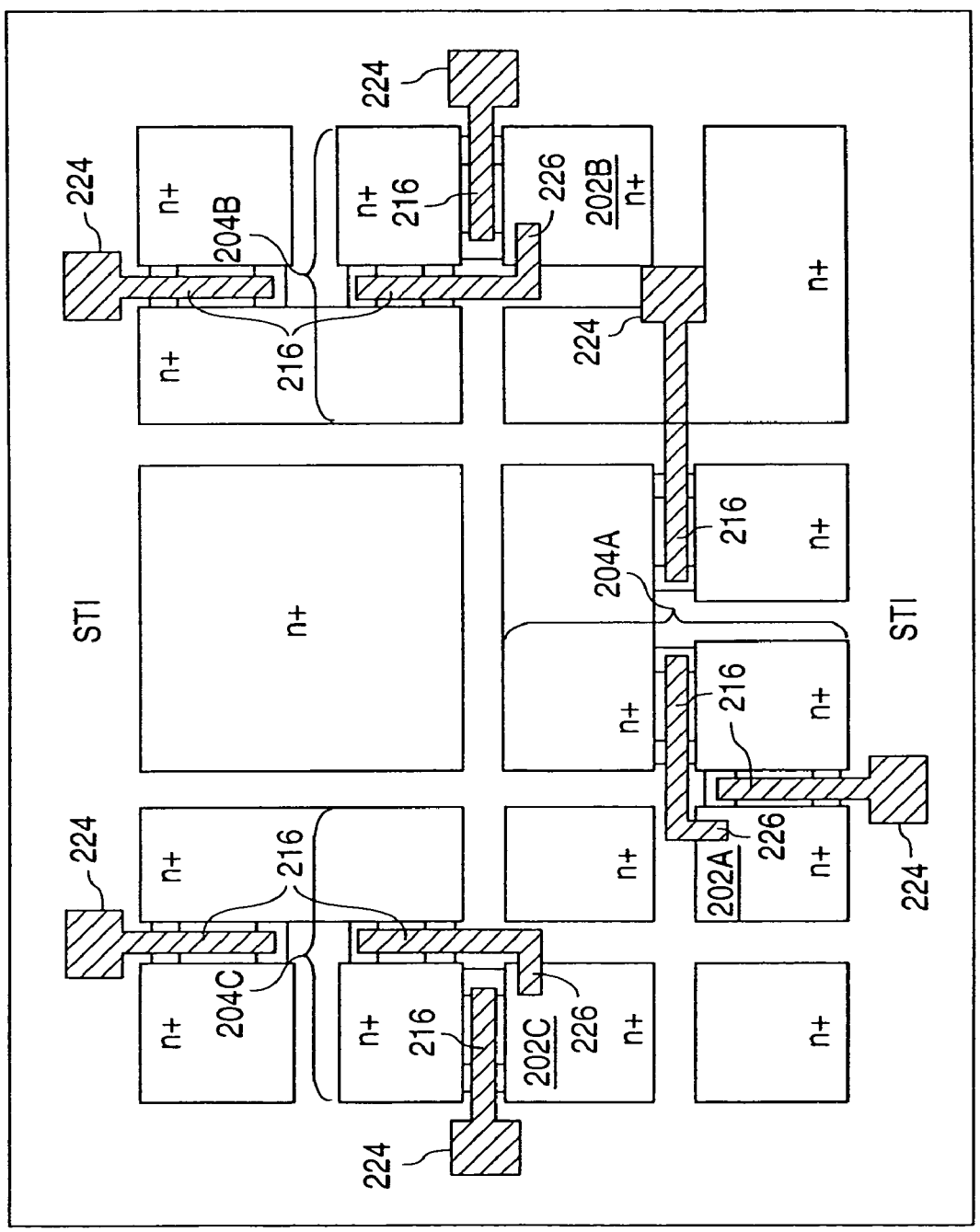
Figure 2E:
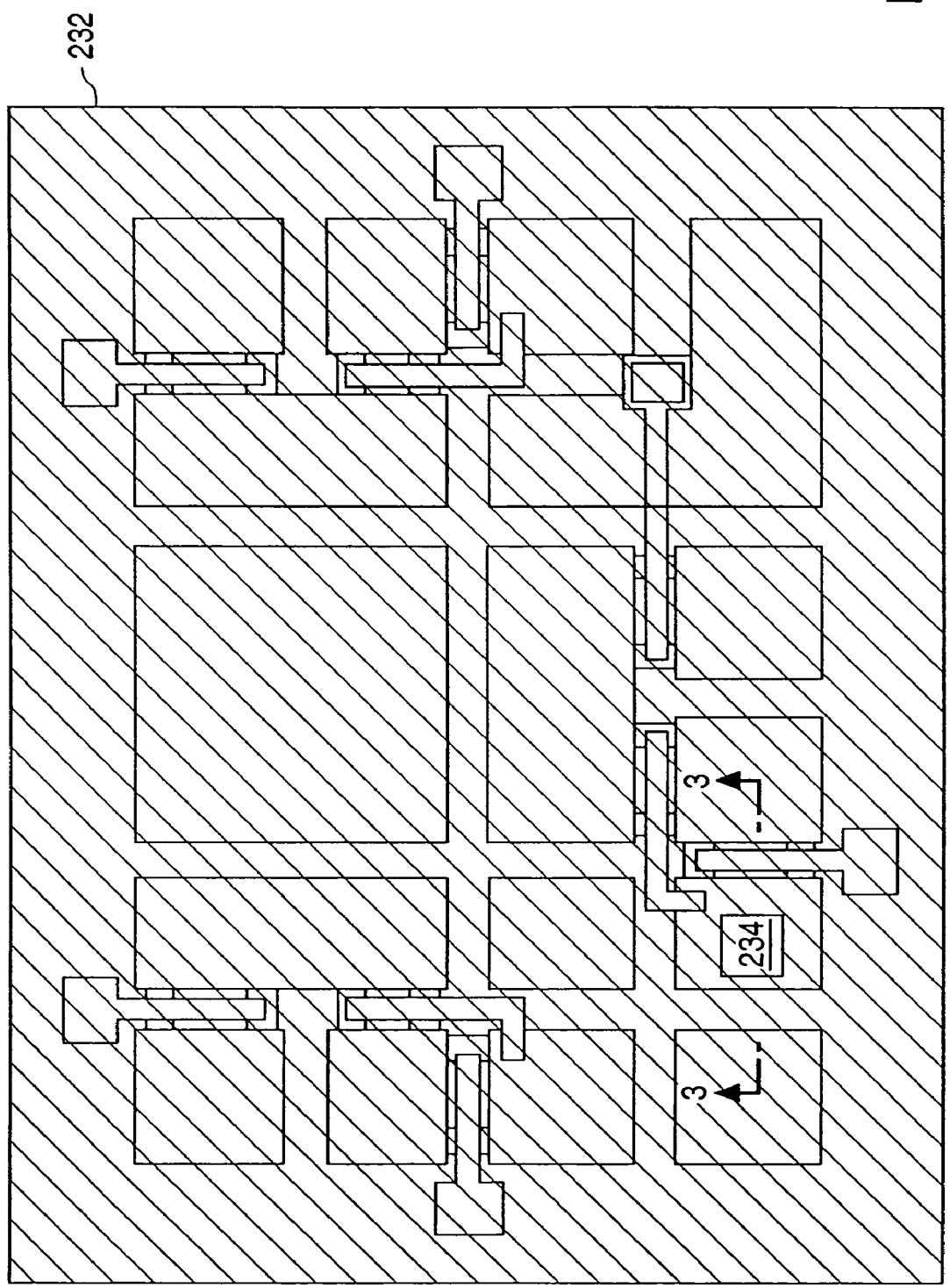
Figure 2F:
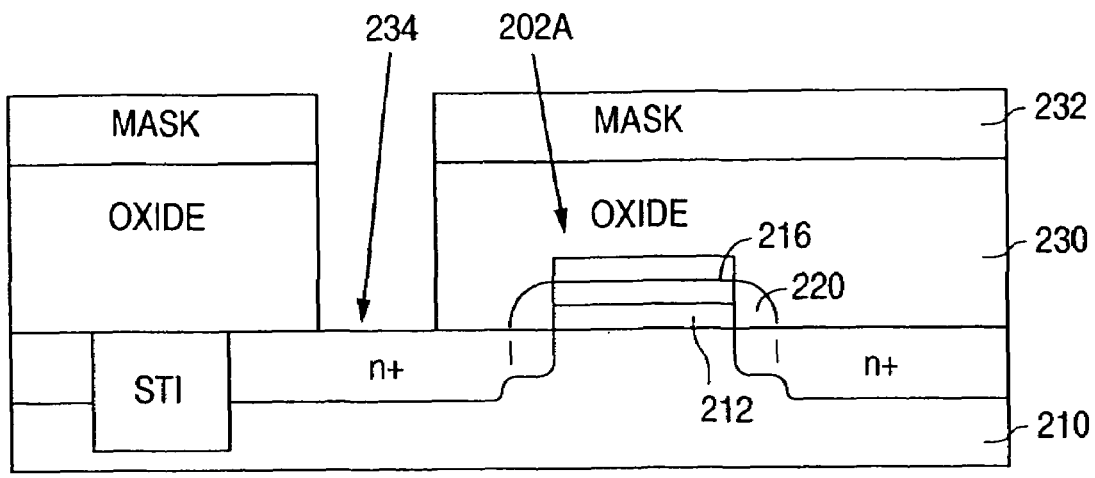
Figure 2G:
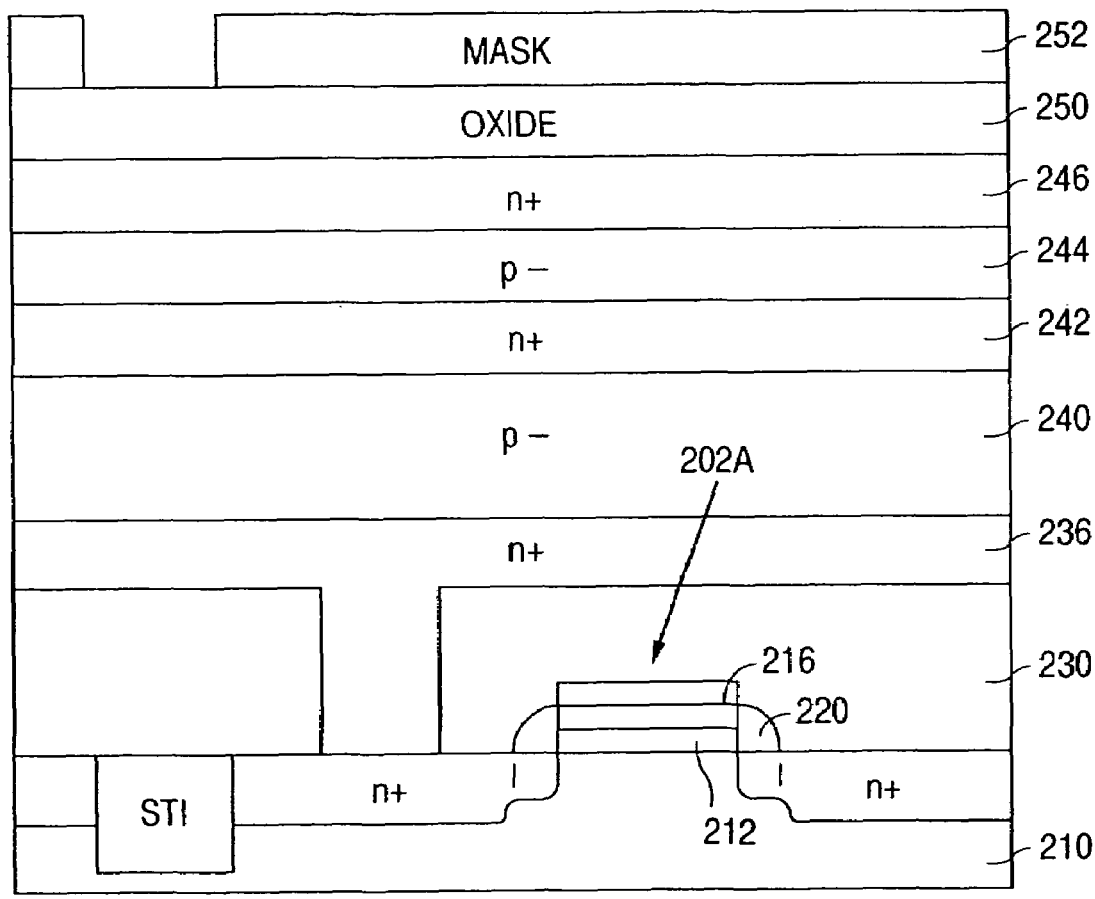
Figure 2H:
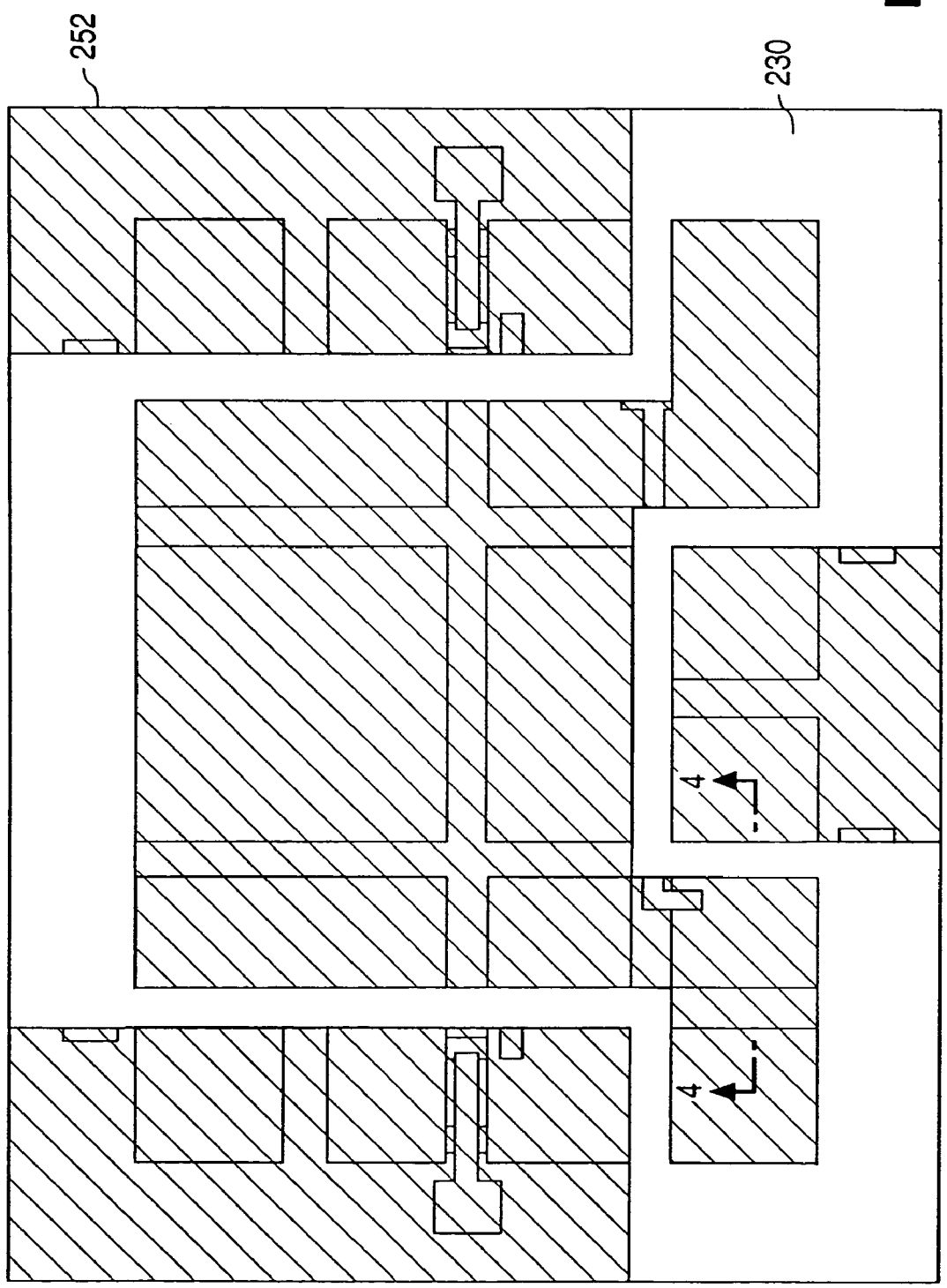
Figure 2I:
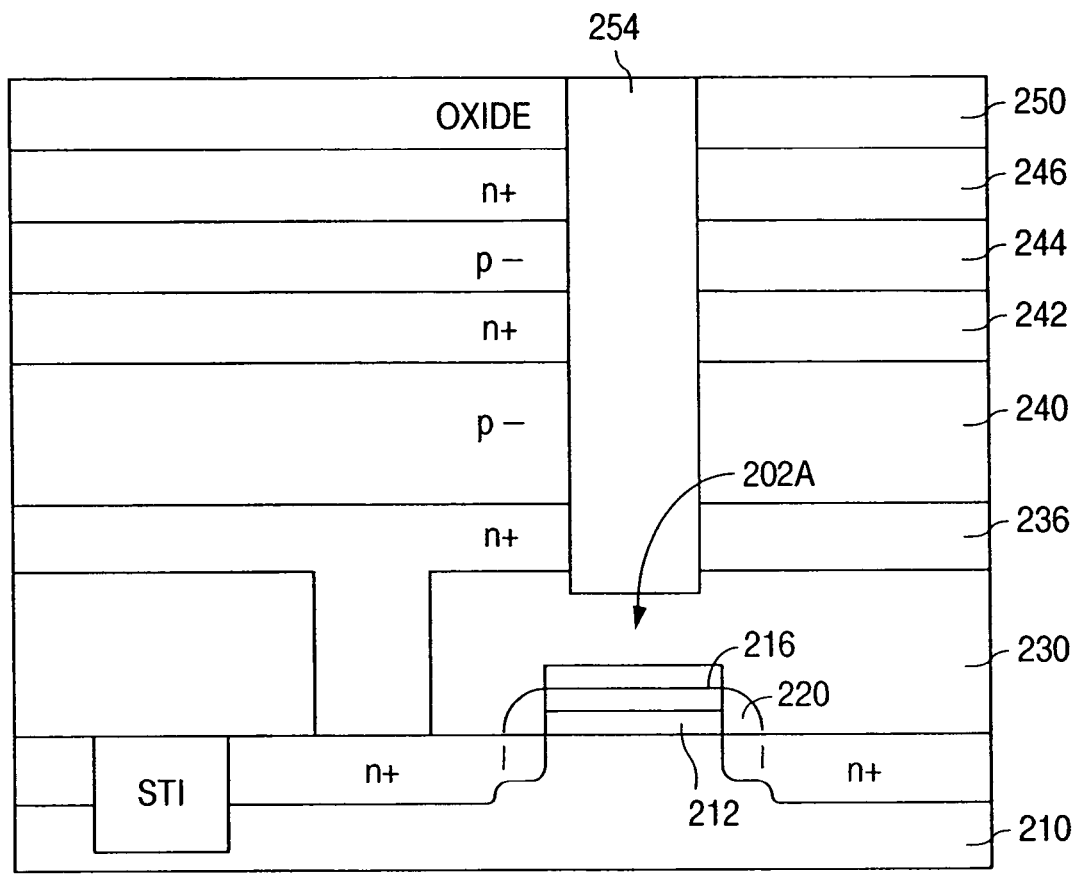
Figure 2J:
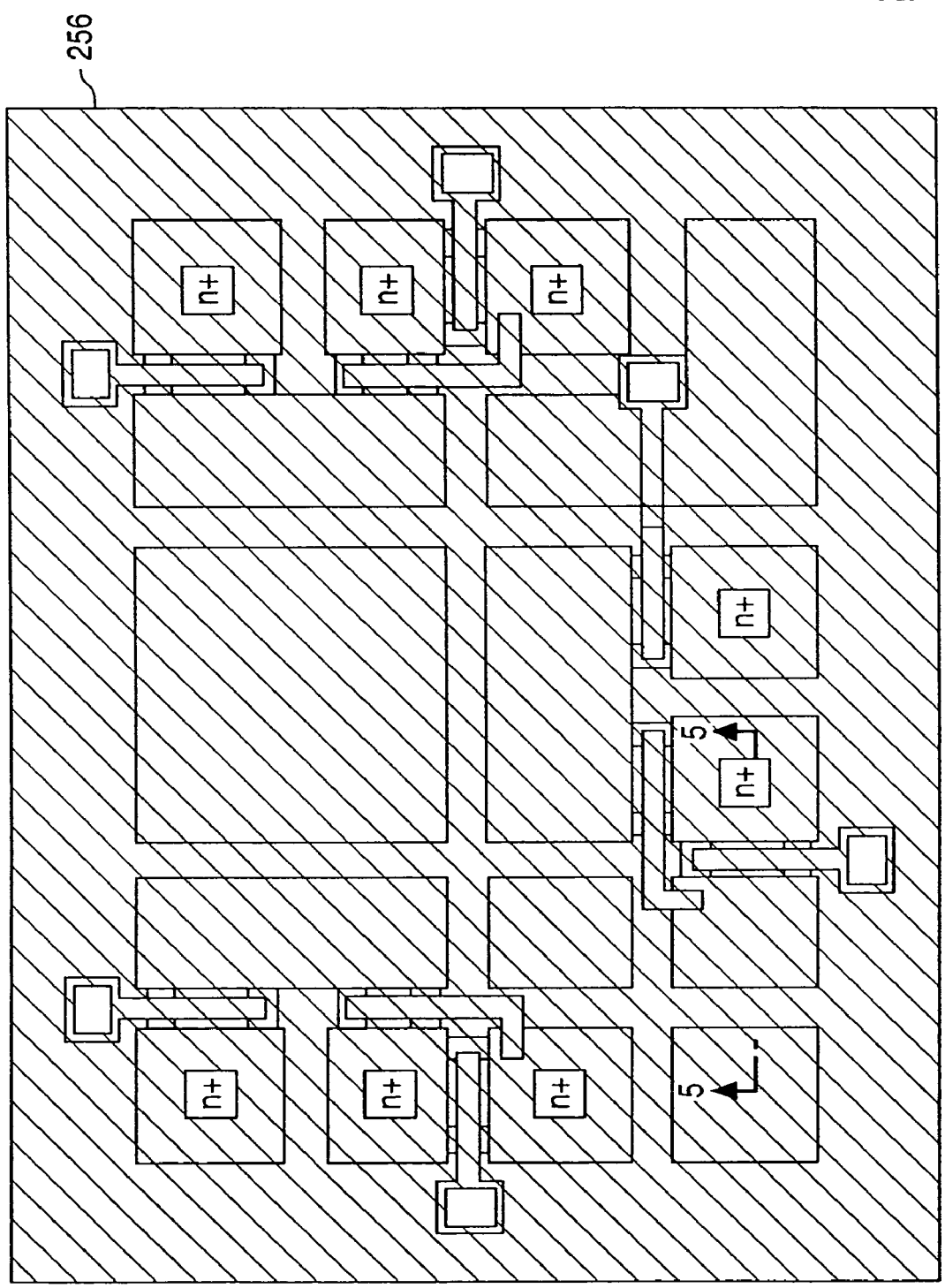
Figure 2K:
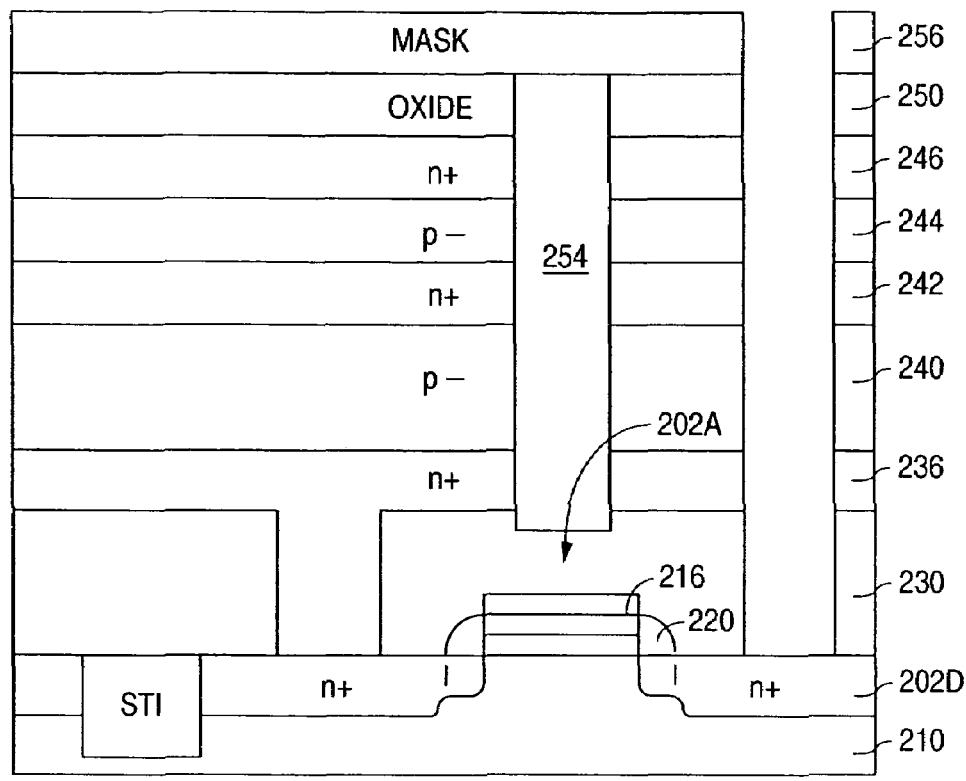
Figure 2L:
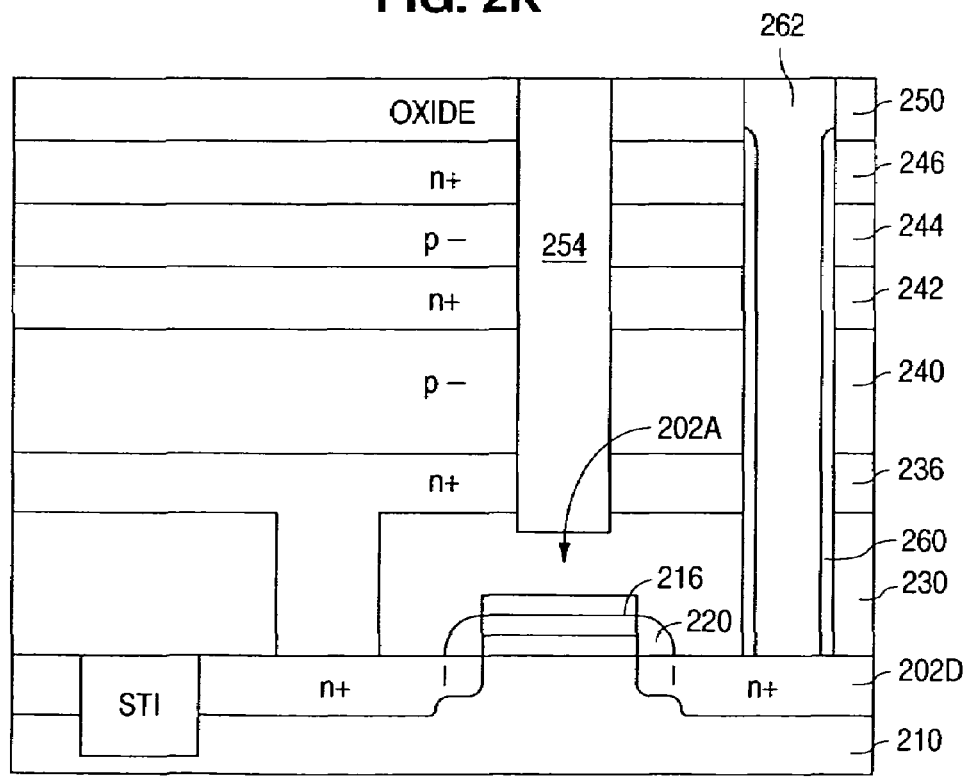
Figure 2M:
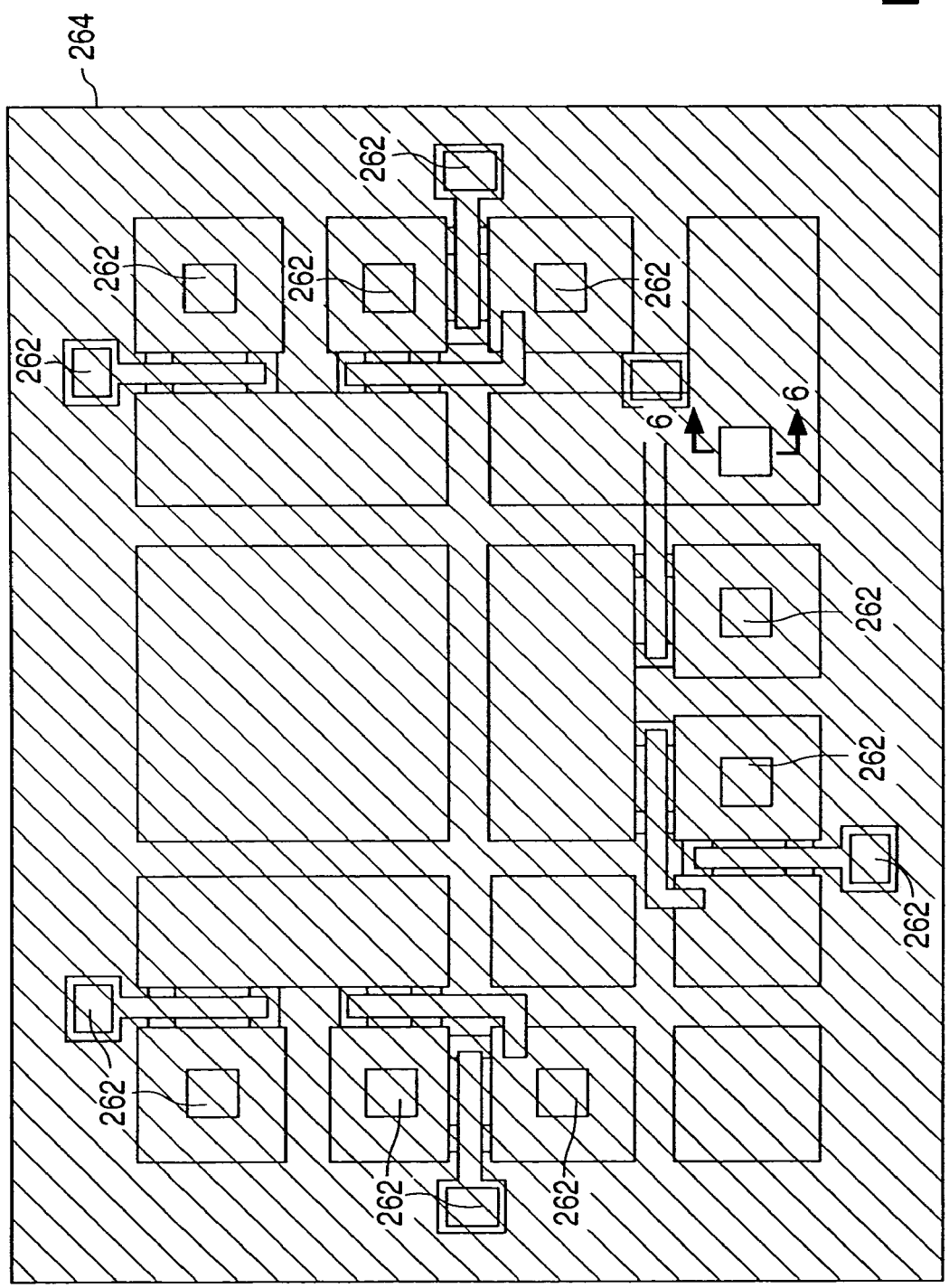
Figure 2N:
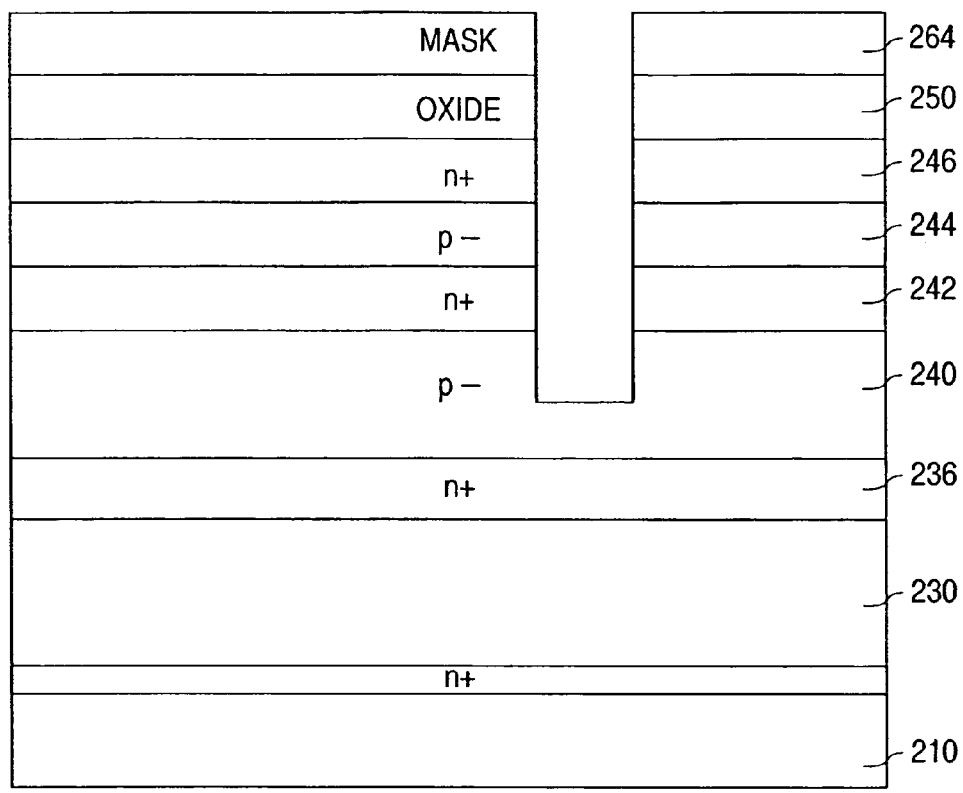
Figure 2O:
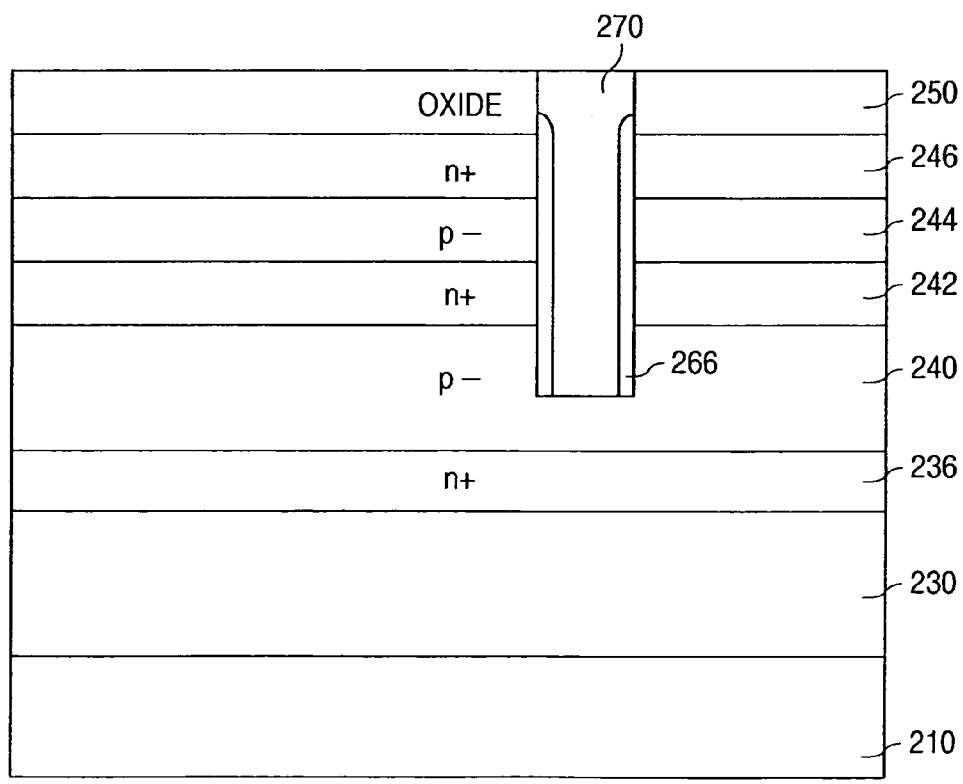
Figure 2P:
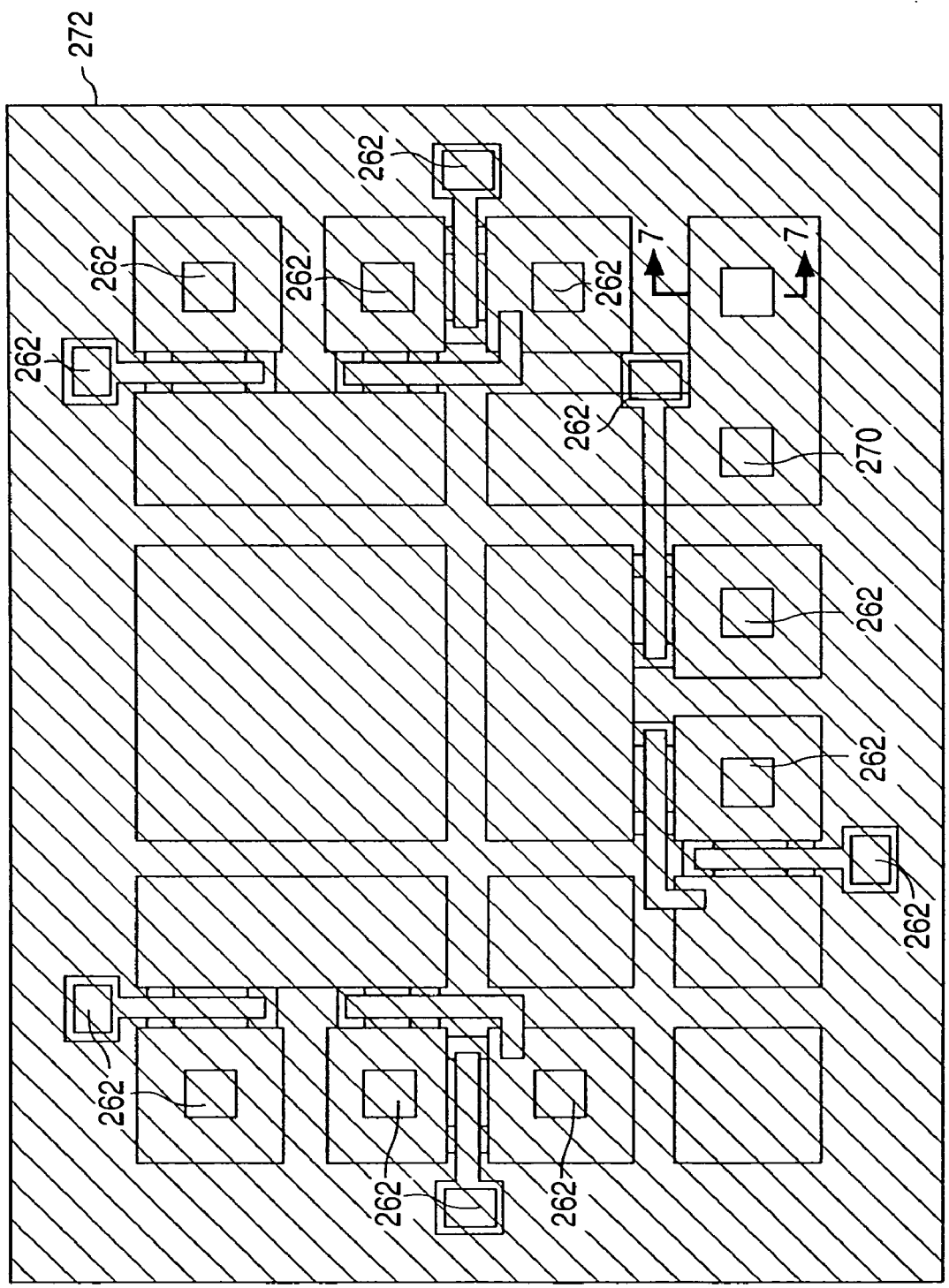
Figure 2Q:
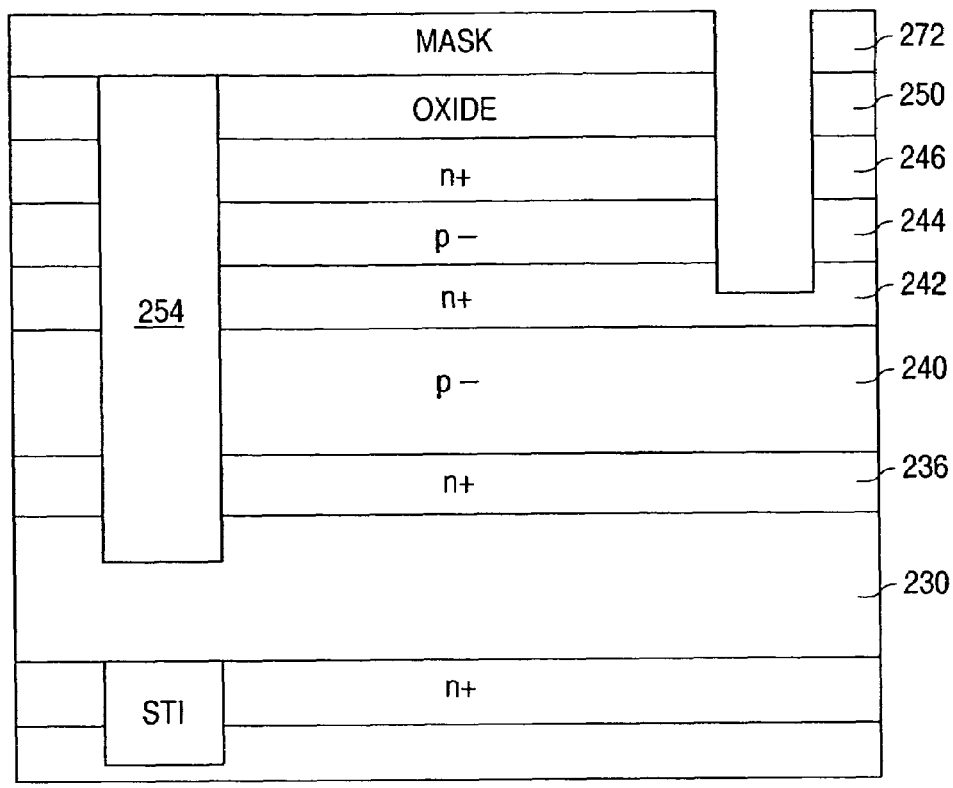
Figure 2R:
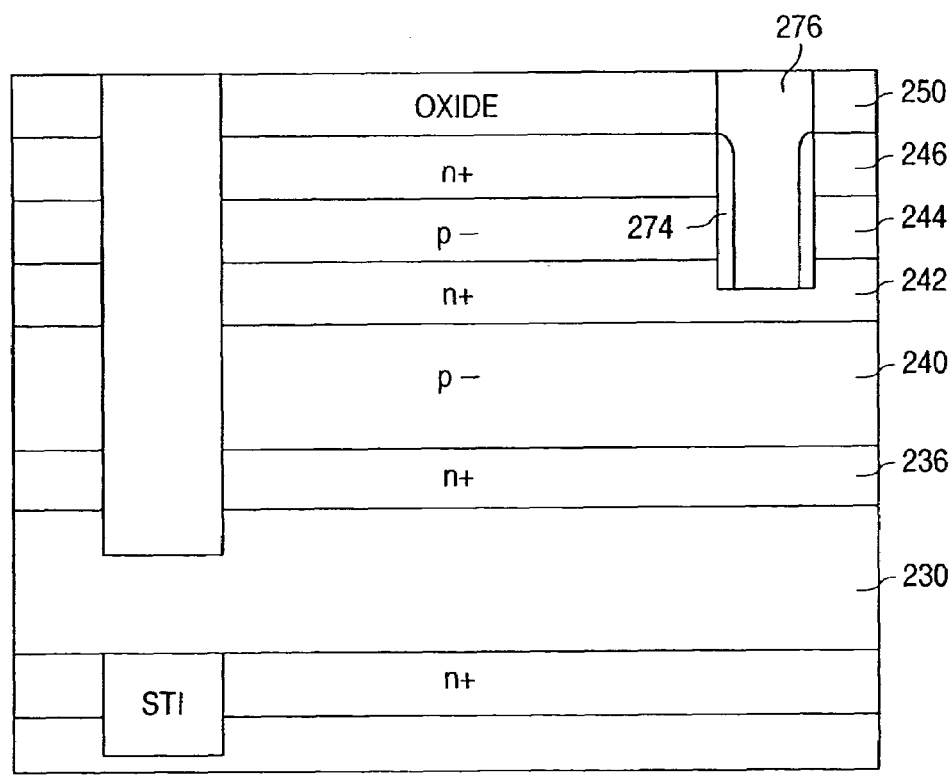
Figure 2S:
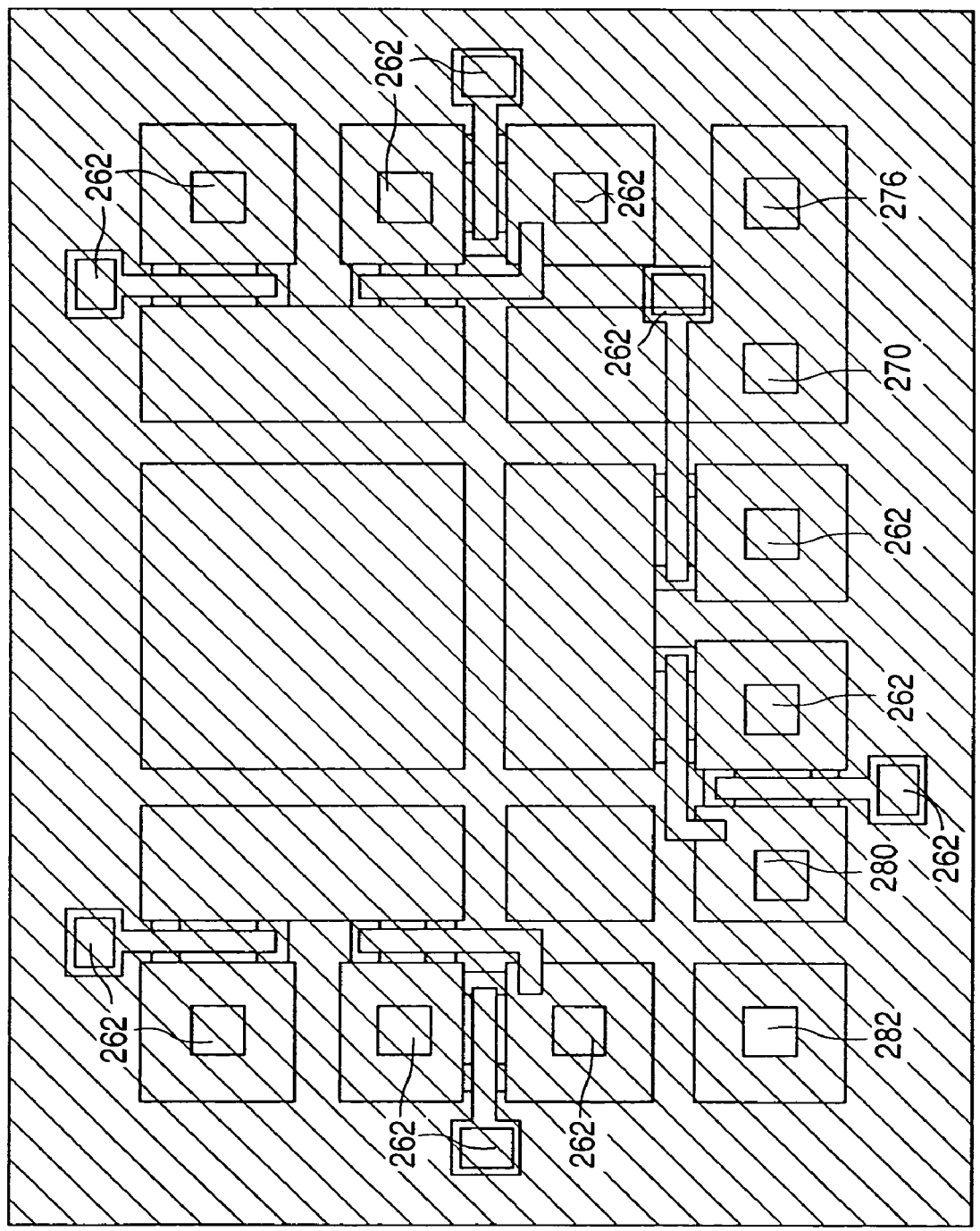
Figure 2T:
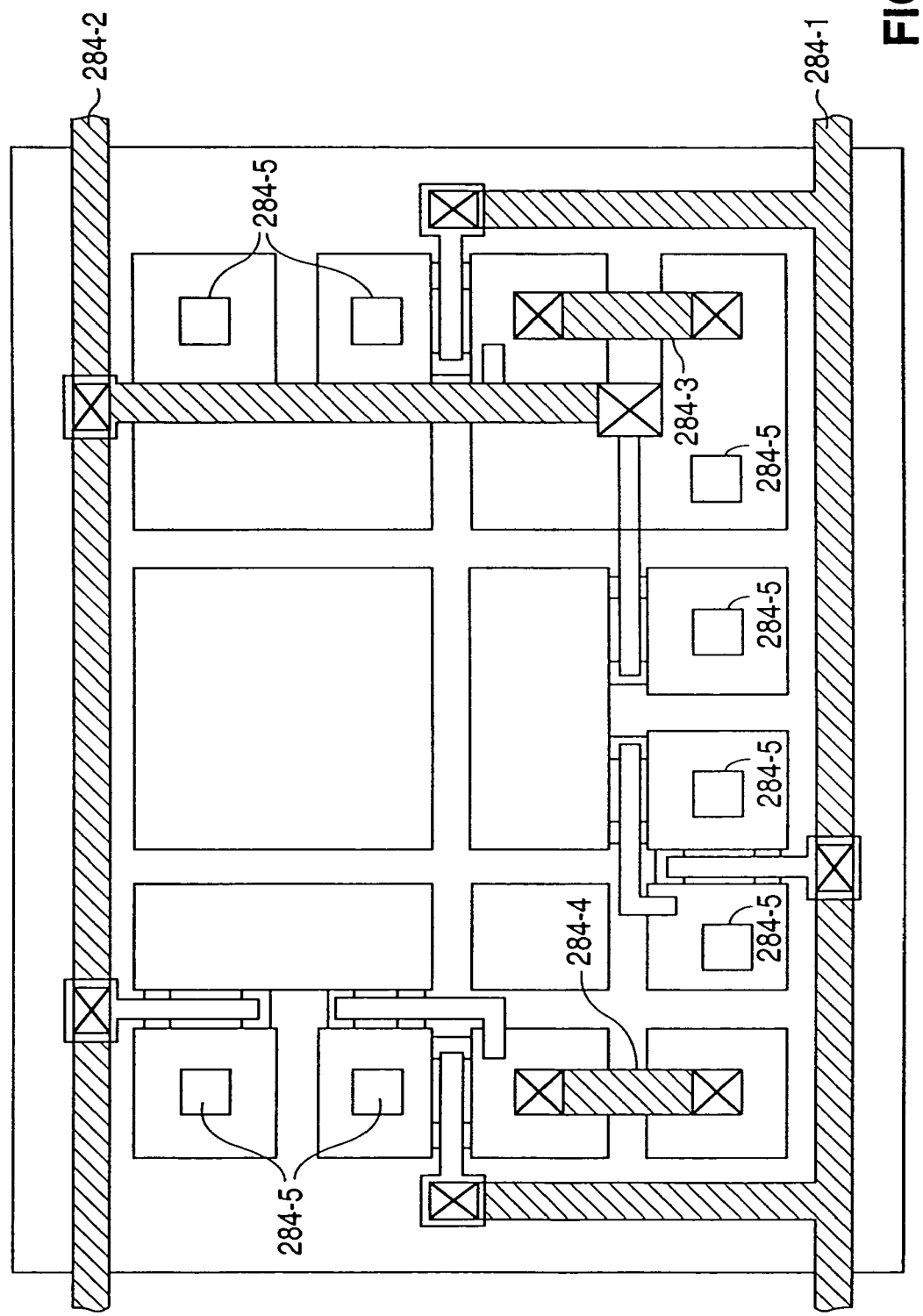
Figure 2V:
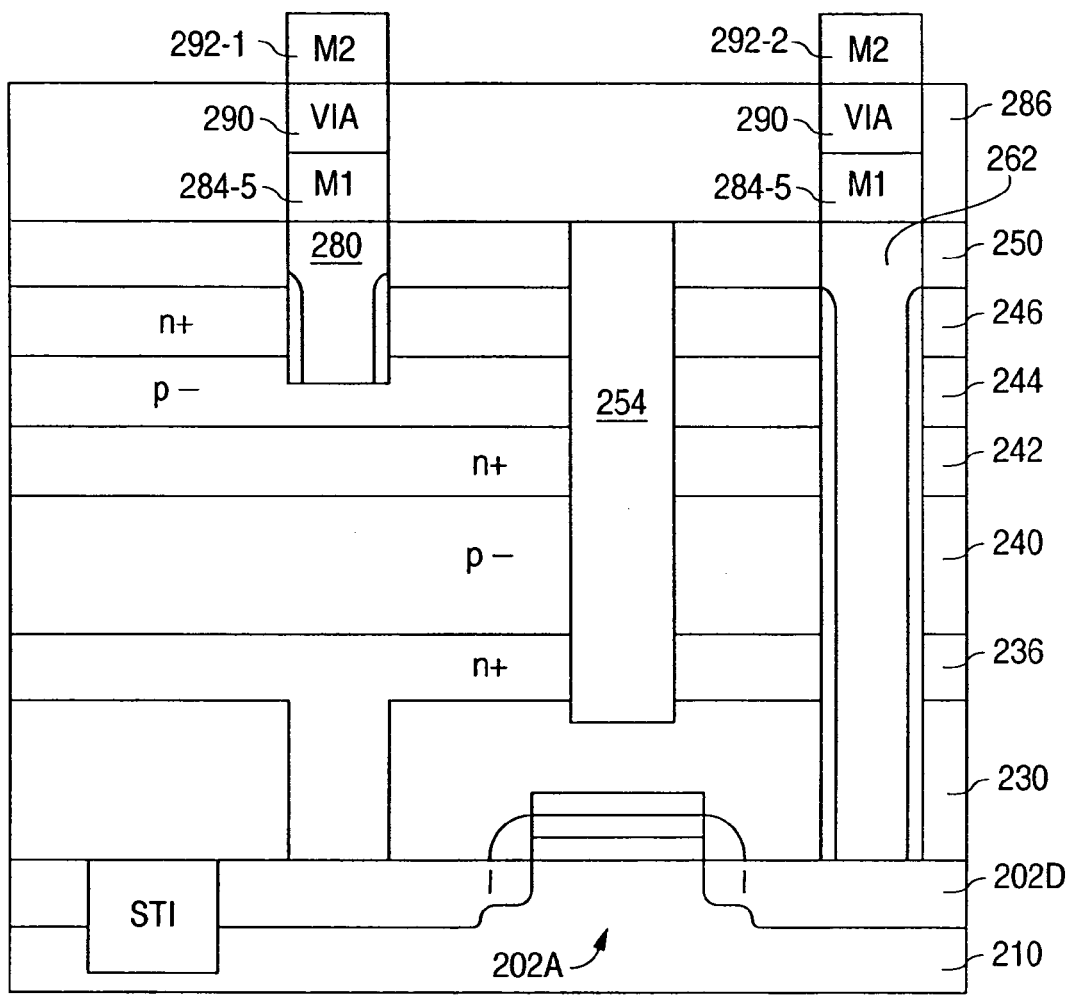
Figure 2W:
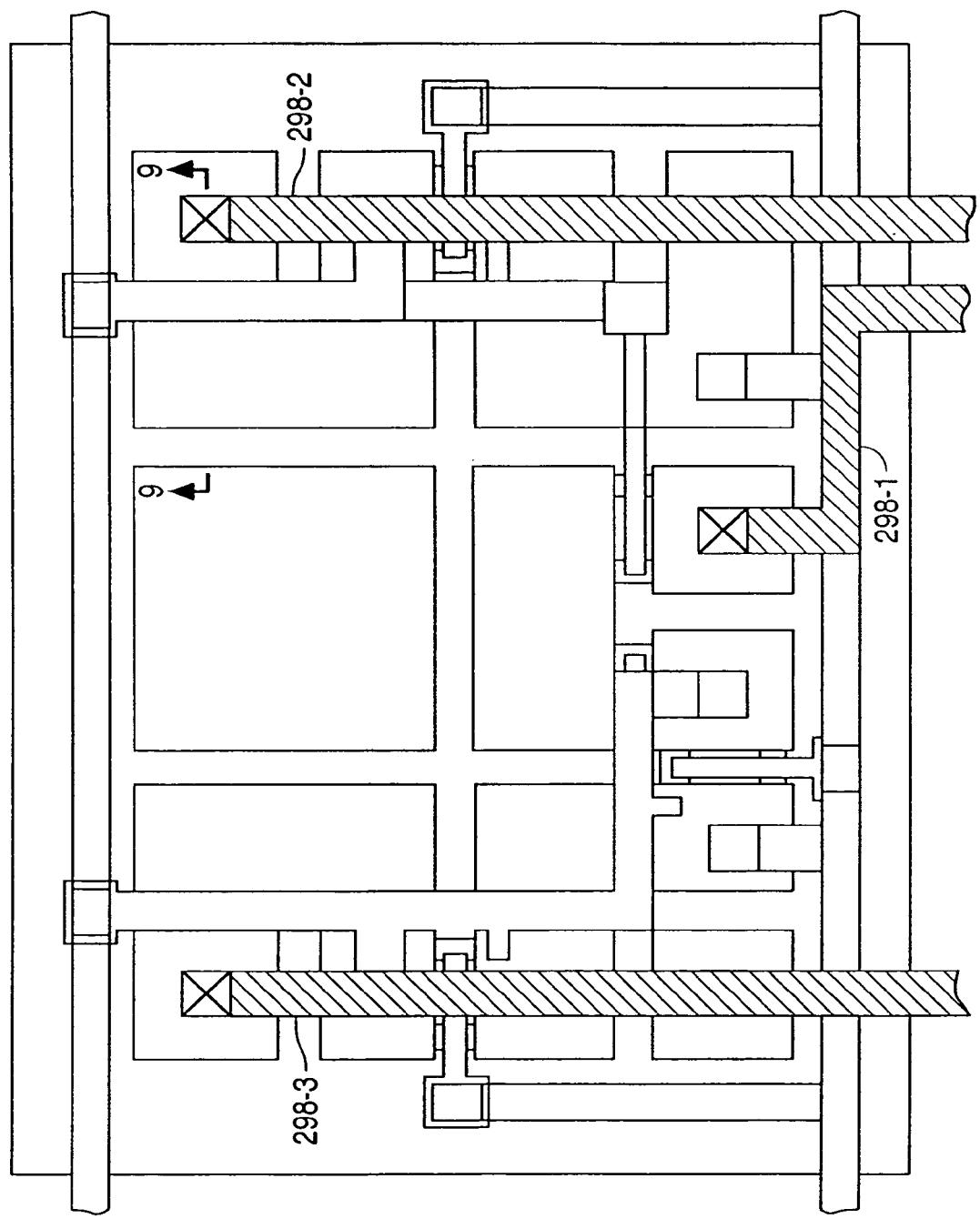
Figure 2X:
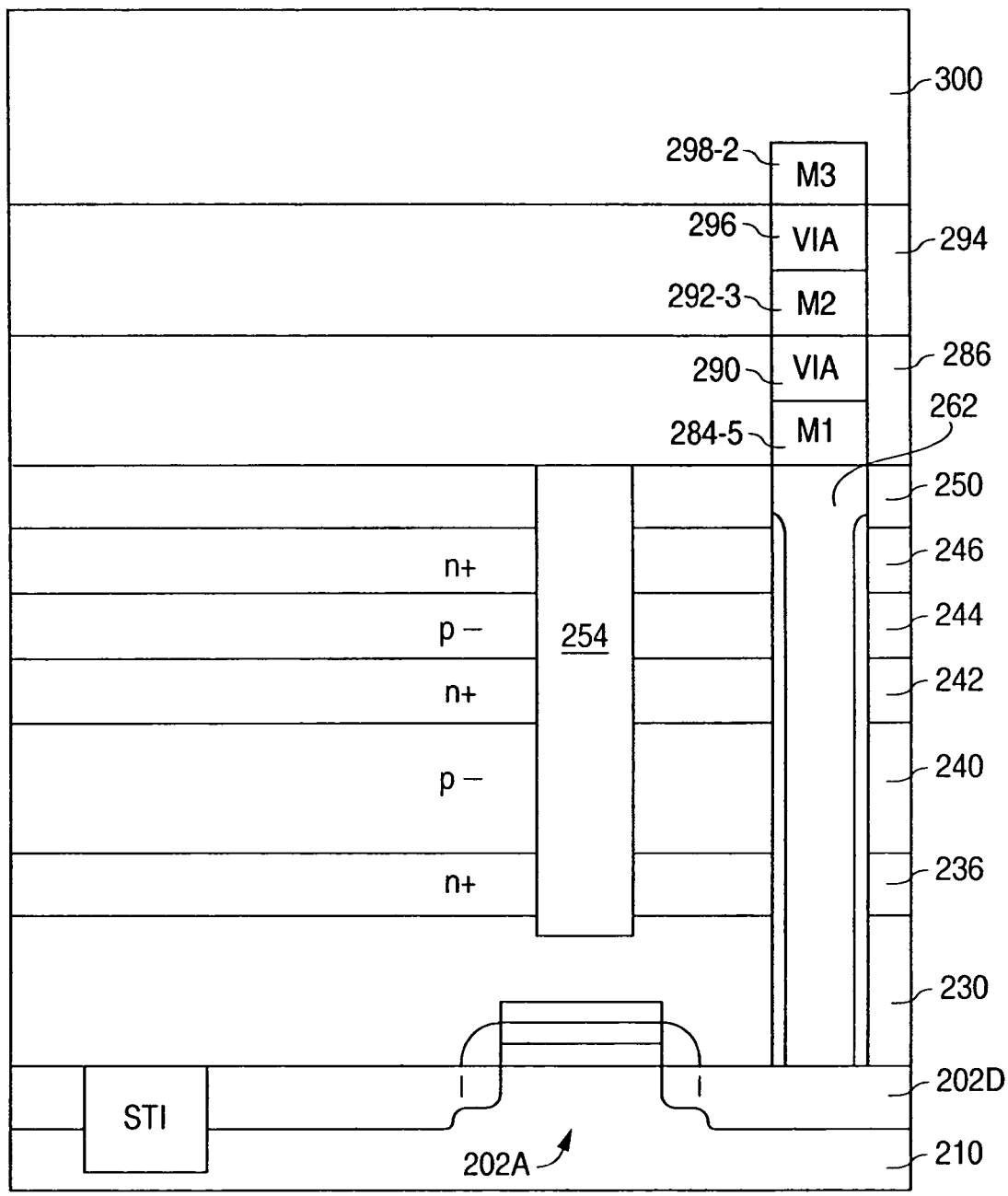

FIGS. 2A–2X show a series of views that illustrate an example of a method of forming a color imaging cell 200 in accordance with the present invention. FIG. 2A shows a plan view that illustrates a first step of the method of the present invention.

As shown in FIG. 2A, the method begins by forming a number of shallow trench isolation regions STI in a p– semiconductor material 210. The shallow trench isolation regions STI provide isolation and partially define the locations of red, green, and blue reset transistors 202A–202C, red, green, and blue source follower transistors 204A–204C, and red, green, and blue select transistors 206A–206C.

The red, green, and blue reset transistors 202A–202C have drain regions 202D and source regions 202S, while the red, green, and blue source-follower transistors 204A–204C have drain regions 204D and source regions 204S. In addition, the red, green, and blue select transistors 206A–206C have drain regions 206D and source regions 206S. As shown in FIG. 2A, the drain regions 202D and 204D are the same physical region, while the source regions 204S and the drain regions 206D are the same physical region.

After the shallow trench isolation regions STI have been formed, a layer of gate oxide 212 is formed on the surface of semiconductor material 210. Next, a layer of polysilicon 214 approximately ½ the desired final gate thickness is formed on gate oxide layer 212. Following this, a mask (not shown) is formed and patterned on polysilicon layer 214.

FIG. 2B shows a plan view that illustrates a next step of the method of the present invention. As shown in FIG. 2B, the exposed regions of polysilicon layer 214 are then etched to form a number of gates 216, and expose the underlying gate oxide layer 212. After this, the mask is removed.

Once the mask has been removed, material 210 and the gates 216 are implanted with an n– type dopant. The implant forms a number of lightly-doped n– type regions n– in p– material 210, and also dopes the gates 216. After this, a layer of insulation material, such as oxide, is formed over the exposed gate oxide layer 212 and the gates 216.

FIG. 2C shows a plan view that illustrates a step of the method of the present invention. As shown in FIG. 2C, after the layer of insulation material has been formed, the layer of insulation material is anisotropicly etched until the layer of insulation material has been removed from the top surfaces of the gates 216. The etch forms side wall spacers 220 on the side walls of the gates 216.

Once the spacers 220 have been formed, material 210 and the gates 216 are again implanted with an n– type dopant. The implant forms a number of heavily-doped n– type regions n+ in p– material 210, and also dopes the gates 216. Following this, the exposed regions of gate oxide layer 212 are removed to expose material 210.

After the exposed regions of gate oxide layer 212 have been removed, a layer of polysilicon 222 approximately ½ the desired final gate thickness is formed on material 210, the regions STI, the gates 216, and spacers 220. Polysilicon layer 222 is then doped to have an n– type conductivity. Following this, a mask (not shown) is formed and patterned on polysilicon layer 222.

FIG. 2D shows a plan view that illustrates a next step of the method of the present invention. As shown in FIG. 2D, the exposed regions of polysilicon layer 222 are then etched to thicken gates 216, and form polysilicon local interconnects 224 that extend out from the gates 216 onto the trench isolation regions STI. The etch also forms polysilicon local interconnects 226 that connect the gates 216 of the source-follower transistors 204A–204C to the sources of the reset transistors 202A–202C. After this, the mask is removed.

FIG. 2E shows a plan view that illustrates a next step of the method of the present invention. FIG. 2F shows a cross-sectional view taken along line 3—3 of FIG. 2E. As shown in FIGS. 2E and 2F, after local interconnects 224 and 226 have been formed and the mask removed, a layer of insulation material 230 is formed on material 210, the isolation regions STI, gates 216, side wall spacers 220, and local interconnects 224 and 226. (Insulation material 230 can be planarized if needed.)

Following this, a mask 232 is formed and patterned over insulation material 230 to define an exposed region. The exposed region of insulation material 230 is then etched to expose a portion 234 of the source of red reset transistor 202A. (Additional n+ regions can also be exposed to provide additional seeds for the subsequent epitaxial lateral overgrowth step.) Once portion 234 has been exposed, the mask is removed.

FIG. 2G shows a cross-sectional view taken along line 3—3 of FIG. 2E. As shown in FIG. 2G, after the portion 234 of the source of red reset transistor 202A has been exposed, an n+ layer 236 is grown on portion 234, and up and over insulation layer 230 using epitaxial lateral overgrowth. Layer 236 is then planarized using conventional techniques, such as chemical mechanical polishing.

Following this, a p– layer 240, an n+ layer 242, a p– layer 244, and an n+ layer 246 are sequentially epitaxially grown as shown in FIG. 2G. Next, a layer of insulation material 250, such as oxide, is formed on n+ layer 246, followed by the formation and patterning of an isolation mask 252.

FIG. 2H shows a plan view that illustrates a next step of the method of the present invention. FIG. 2I shows a cross-sectional view taken along line 4—4 of FIG. 2H. As shown in FIGS. 2H and 2I, after mask 252 has been formed, the exposed regions of oxide layer 250, n+ layer 246, p– layer 244, n+ layer 242, p– layer 240, n+ layer 236, and oxide layer 230 are etched to form an opening that exposes oxide layer 230. Following the etch, mask 252 is removed and a region of oxide 254 is formed in the opening. Oxide region 254 isolates n+ layer 236, p– layer 240, n+ layer 242, p– layer 244, and n+ layer 246 from laterally adjacent regions.

FIG. 2J shows a plan view that illustrates a next step of the method of the present invention. FIG. 2K shows a cross-sectional view taken along line 5—5 of FIG. 23. FIG. 2L shows a cross-sectional view taken along line 5—5 of FIG. 2J. As shown in FIGS. 2J and 2K, after oxide region 254 has been formed, a mask 256 is formed and patterned on oxide layer 250 and oxide region 254.

Following this, the exposed regions of oxide layer 250, n+ layer 246, p– layer 244, n+ layer 242, p– layer 240, n+ layer 236, and oxide layer 230 are etched to form a number of openings that expose the heavily-doped n+ source and drain regions 202S–206S and 202D–206D, and the local interconnects 224 and 226. (The source region of red reset transistor 202A is not exposed.)

Following the etch, as shown in FIG. 2L, mask 256 is removed and a layer of oxide 260 is formed in the openings to provide an isolation layer. The wafer is then anisotropicly etched to remove oxide layer 260 from the bottom of the openings. Contacts 262 are then formed in the openings to make electrical connections with the n+ source and drain regions 202S–206S and 202D–206D, and the local interconnects 224 and 226.

FIG. 2M shows a plan view that illustrates a next step of the method of the present invention. FIG. 2N shows a cross-sectional view taken along line 6—6 of FIG. 2M. FIG. 2O shows a cross-sectional view taken along line 6—6 of FIG. 2M. As shown in FIGS. 2M and 2N, after contacts 262 have been formed, a mask 264 is formed and patterned on oxide layer 250, (oxide region 254) and contacts 262.

Following this, the exposed regions of oxide layer 250, n+ layer 246, p– layer 244, n+ layer 242, and p– layer 240 are etched to form an opening that exposes p– layer 240. Following the etch, as shown in FIG. 2O, mask 264 is removed and a layer of oxide 266 is formed in the opening to provide an isolation layer. The wafer is then anisotropicly etched to remove oxide layer 266 from the bottom of the openings. A contact 270 is then formed in the opening to make an electrical connection with the p– layer 240.

FIG. 2P shows a plan view that illustrates a next step of the method of the present invention. FIG. 2Q shows a cross-sectional view taken along line 7—7 of FIG. 2P. FIG. 2R shows a cross-sectional view taken along line 7—7 of FIG. 2P. As shown in FIGS. 2P and 2Q, after contact 270 has been formed, a mask 272 is formed and patterned on oxide layer 250, oxide region 254, contacts 262, and contact 270.

Following this, the exposed regions of oxide layer 250, n+ layer 246, p– layer 244, n+ layer 242, and p– layer 240 are etched to form an opening that exposes n+ layer 242. Following the etch, as shown in FIG. 2R, mask 272 is removed and a layer of oxide 274 is formed in the openings to provide an isolation layer. The wafer is then anisotropically etched to remove oxide layer 274 from the bottom of the openings. A contact 276 is then formed in the opening to make an electrical connection with n+ layer 242.

FIG. 2S shows a plan view that illustrates a next step of the method of the present invention. As shown in FIG. 2S, similar steps are used to form a contact 280 that makes an electrical connection with p– layer 244, and a contact 282 that makes an electrical connection with n+ layer 246.

FIG. 2T shows a plan view that illustrates a next step of the method of the present invention. After contacts 280 and 282 have been formed, a first layer of metal (metal-1) is formed on oxide layer 250, oxide region 254, contacts 262, 270, 276, 280, and 282. Next, a mask (not shown) is formed and patterned on the metal-1 layer. Following this, the exposed regions of the metal-1 layer are etched to form a number of metal-1 traces.

As shown in FIG. 2T, the metal-1 traces include a first metal-1 trace 284-1 that is connected to the gate 216 of each reset transistor 202A–202C, and a second metal-1 trace 284-2 that is connected to the gate 216 of each select transistor 206A–206C. In addition, the metal-1 traces also include a first strap 284-3 that connects the green photodiode to the source of the green reset transistor, and a second strap 284-4 that connects the blue photodiode to the source of the blue reset transistor. Further, metal-1 pads 284-5 are formed on the remaining contacts to provide vertical connections to the next metal level.

FIG. 2U shows a plan view that illustrates a next step of the method of the present invention. FIG. 2V shows a cross-sectional view taken along line 8—8 of FIG. 2U. After metal-1 traces 284-1 through 284-5 have been formed, a layer of isolation material 286 is formed on metal-1 traces 284-1 through 284-5, oxide layer 250, and oxide region 254. Next, a number of vias 290 are formed through isolation layer 286 to make electrical connections with the metal-1 pads 284-5.

Following this, a second layer of metal (metal-2) is formed on isolation layer 286 and vias 290. Next, a mask (not shown) is formed and patterned on the metal-2 layer. Once the mask has been formed and patterned, the exposed regions of the metal-2 layer are etched to form a number of metal-2 traces. As shown in FIG. 2U, the metal-2 traces include a first metal-2 trace 292-1 that is connected to the p– layers 240 and 244, and a second metal-2 trace 292-2 that is connected to the drains of reset transistors 202A–202C. Further, metal-2 pads 292-3 are formed on the remaining vias to provide vertical connections to the next metal level.

FIG. 2W shows a plan view that illustrates a next step of the method of the present invention. FIG. 2X shows a cross-sectional view taken along line 9—9 of FIG. 2W. After metal-2 traces 292-1 and 292-2 have been formed, a layer of isolation material 294 is formed on metal-2 traces 292-1 and 292-2, metal-2 pads 292-3, and isolation layer 286. Next, a number of vias 296 are formed through isolation layer 294 to make electrical connections with the metal-2 pads 292-3.

Following this, a third layer of metal (metal-3) is formed on isolation layer 294 and vias 296. Next, a mask (not shown) is formed and patterned on the metal-3 layer. Once the mask has been formed, the exposed regions of the metal-3 layer are etched to form a number of metal-3 traces. The mask is then removed.

As shown in FIG. 2W, the metal-3 traces include a first metal-3 trace 298-1 that is connected to the source of red select transistor 206A, a second metal-2 trace 298-2 that is connected to the source of green select transistor 206B, and a third metal-3 trace 298-3 that is connected to the source of blue select transistor 206C.

After metal-3 traces 298-1 through 298-3 have been formed, a layer of isolation material 300 is formed on metal-3 traces 298-1 through 298-3 and isolation layer 294. Following this, the method continues with conventional back end processing steps.

The present invention provides an increased photodiode area by utilizing the areas formed over the n+ implanted regions that form the sources of the source-follower transistors and the drains of the select transistors. As shown in FIG. 2H, the vertically-stacked photodiodes are formed inside of the opening that exposes insulation layer 230 which, as shown in FIG. 2A, includes the source and drain regions 204S and 206D, and additional regions.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A device comprising:
   an imaging cell formed on a layer of semiconductor material of a first conductivity type, the imaging cell comprising:
   a first transistor having a first region of a second conductivity type formed in the layer of semiconductor material, and a second region of the second conductivity type formed in the layer of semiconductor material;
   an isolation layer formed on the first transistor; and
   a region of crystalline semiconductor material having epitaxial lateral overgrowth formed on the isolation layer over the first transistor, the region of semiconductor material having:
   a first layer of the second conductivity type;
   an overlying second layer of the first conductivity type;
   a third layer of the second conductivity type formed on the second layer;
   a fourth layer of the first conductivity type formed on the third layer; and
   a fifth layer of the second conductivity type formed on the fourth layer.

2. The device of claim 1 wherein the first layer contacts the first region of the first transistor.

3. The device of claim 1 wherein:
   the first layer and the second layer form a first photodiode;
   the second layer and the third layer form a second photodiode; and
   the fourth layer and the fifth layer form a third photodiode.

4. The device of claim 3 and further comprising:
   a second transistor having a source connected to the third layer, a drain, and a gate;
   a third transistor having a source connected to the fifth layer, a drain, and a gate;
   a fourth transistor having a source, a drain, and a gate connected to the first region of the first transistor;
   a fifth transistor having a source, a drain, and a gate connected to the source of the second transistor; and
   a sixth transistor having a source, a drain, and a gate connected to the source of the third transistor.

5. The device of claim 4 wherein the first, second, and third photodiodes are formed over the first region of the first transistor, and the source regions of the second and third transistors.

* * * * *